United States Patent [19]

McDonald

[11] Patent Number: 4,638,257

[45] Date of Patent: Jan. 20, 1987

[54] AMPLIFICATION BY A PHASE LOCKED ARRAY OF JOSEPHSON JUNCTIONS

[75] Inventor: Donald G. McDonald, Boulder, Colo.

[73] Assignee: The United States of America as represented by the Secretary of Commerce, Washington, D.C.

[21] Appl. No.: 801,972

[22] Filed: Nov. 26, 1985

[51] Int. Cl.$^4$ .............................................. H03F 19/00
[52] U.S. Cl. .................................. 330/61 R; 307/306
[58] Field of Search ............. 330/60, 62, 61 R, 61 A, 330/63; 357/5; 307/306

[56] References Cited

U.S. PATENT DOCUMENTS 4,371,796 2/1983 Takada ................................. 307/476

FOREIGN PATENT DOCUMENTS 124779 7/1984 Japan ...................................... 357/5

OTHER PUBLICATIONS

Clarke et al, "Josephson-Junction Amplifier," *Applied Physics Letters*, vol. 19, No. 11, Dec. 1, 1971, pp. 469-471.
Clark et al, "Feasibility of Hybrid Josephson Field Effect Transistors," *J. Appl. Phys.*, vol. 51, No. 5, May 1980, pp. 2736-2738, 2741-2743.
Faris, "Quiteron," *IEEE Transactions on Magnetics*, vol. MAG-19, No. 3, May 1983, pp. 1293-1295.
Feldman, "The Thermally Saturated Suparamp," *J. of Applied Physics*, vol. 48, No. 3, Mar. 1977, pp. 1301-1310.
Gray, "A Superconducting Transistor", *Appl. Phys. Lett.*, vol. 32, No. 6, Mar. 15, 1978, pp. 392-395.
Hilbert et al, "Radio-Frequency Amplifier Based on a DC Superconducting Quantum Interference Device," *Appl. Phys. Lett.*, vol. 43, No. 7, Oct. 1, 1983, pp. 694-696.
Kuzmin et al, "Microwave Receivers Using SQUIDS and Josephson Junction Arrays," *IEEE Trans. on Magnetics*, vol. MAG-17, No. 1, Jan. 1981, pp. 822-825.
Likharev, "The Properties of a Josephson Triode," *Radio Engineering & Electronic Physics*, vol. 20, Mar. 1975, pp. 135-137.
Parrish et al, "Four Photon Parametric Amplification", *Revue De Physique Appliquee*, Tome 9, Jan. 1974, pp. 229-232.
Van Zeghbroeck, "Superconducting Current Injection Transistor, *Appl. Phys. Lett.*, vol. 42, No. 8, Apr. 15, 1983, pp. 736-738.
Zimmerman, "High-Frequency Limitations of the Double-Junction SQUID Amplifier," *Appl. Phys. Lett.*, vol. 31, No. 5, Sep. 1, 1977, pp. 360-362.

*Primary Examiner*—James B. Mullins
*Attorney, Agent, or Firm*—Eugene J. Pawlikowski; Alvin J. Englert; Kirk M. Hudson

[57] ABSTRACT

A Josephson junction amplifier comprising an array of series connected Josephson junctions which are maintained in a finite voltage, mutually electromagnetically phase-locked state. An input signal is applied across a first group of one or more but less than all of the Josephson junctions, and the output is taken across a second group of the junctions which has a greater number of junctions than the first group. Alternatively, two arrays may be connected in parallel to provide stable electromagnetic phase locking.

8 Claims, 14 Drawing Figures

AMPLIFICATION BY A PHASE LOCKED ARRAY OF JOSEPHSON JUNCTIONS

BACKGROUND OF THE INVENTION

Much of the recent research with Josephson junctions and their circuits, including that involving superconducting quantum interference devices (SQUIDs), has focused on the digital applications of such devices, primarily because of their extremely fast switching ability.

As discussed for example in U.S. Pat. No. 4,371,796 (Takada), such digital devices rely on the ability of a SQUID to quickly switch between a zero voltage state and a finite-voltage state due to changes in the magnetic flux through the loop of the SQUID, or by passing current exceeding the Josephson junction critical current through the SQUID, causing it to switch quickly between its two voltage states.

Although research has been ongoing for a number of years concerning the use of Josephson junctions for linear or analog amplification, it has proved to be difficult to produce a general purpose amplifier, which, in the present context, is defined to be an amplifier with the following properties: (a) apart from the signal which is to be amplified, it requires a source of power only at dc; (b) it must amplify all signals in a frequency range from zero up to some cut-off frequency; and (c) it must have an input impedance that is in the technically desirable range of one ohm or greater.

An example of previous work in this area is described in an early publication on Josephson junction amplifiers by J. Clarke, et al.: "Josephson-Junction Amplifier", Applied Physics Letters, Vol. 19, page 469 (1971). Clarke, et al. describe an inductively coupled asymmetric SQUID amplifier. Apart from an added resistance $R_i$, the input impedance of this amplifier is very low, much less than an ohm and in essence an electrical short at low frequencies. Such low input impedance is common to practical Josephson junction amplifiers with an input that is inductively coupled, but it is technically undesirable for many applications.

Another early proposed amplifier configuration is discussed by Likharev in "The Properties of a Josephson Triode", Radio Engineering and Electronic Physics, Vol. 20, page 135 (1975). This amplifier employs a triangular configuration of three Josephson junctions. Several modes of operation are proposed but the detailed technical properties of this proposed amplifier have not been evaluated either theoretically or experimentally in the published literature.

A superconducting parametric amplifier based on Josephson junctions is discussed by Parrish, et al., in "Four Photon Parametric Amplification", Revue de Physique Appliquee, Vol. 9, page 229 (1974). This amplifier, later known as the SUPARAMP (see, for example, Feldman, "The thermally Saturated SUPARAMP", Journal of Applied Physics, Vol. 48, page 1301 (1977)) comprises a series array of Josephson junctions. It amplifies only at radio or microwave frequencies and requires a microwave frequency pump.

A SQUID amplifier is discussed by Zimmerman, et al., in "High Frequency Limitations of the Double-Junction SQUID Amplifier", Applied Physics Letters, Vol. 31, page 360 (1977). This amplifier, which is discussed as a radio or microwave frequency amplifier, could be used at frequencies extending down to dc, but, due to the inductive coupling of the input, its effective input impedance at low frequencies would be much less than one ohm. In this respect it is similar to the amplifier of Clarke, et al., discussed above.

A theoretical amplifier design is described by T. D. Clarke, et al., in "Feasibility of Hybrid Josephson Field Effect Transistors", Journal of Applied Physics, Vol. 51, page 2736 (1980). Such a transistor comprises a coplanar superconductor-semiconductor-superconductor Josephson junction with an insulated gate formed over the semiconducting channel. However, the recommended semiconductor material is difficult to fabricate and experimental results are not available to confirm that the design is practical.

Yet another Josephson junction amplifier is discussed by Van Zeghbroeck in "Superconducting Current Injection Transistor", Applied Physics Letters, Vol. 42, page 736 (1983). This amplifier consists of a large area Josephson junction in which the spatial distribution of the current is varied by a magnetic field produced by a control current. This device is capable of amplification over a wide frequency range but it has an input impedance so low that it is effectively a short at low frequencies.

A recently developed SQUID amplifier is discussed by Hilbert, et al., in "Radio-Frequency Amplifier Based on a dc Superconducting Quantum Interfernce Device", Applied Physics Letters, Vol. 43, page 694 (1983). Although only the radio frequency properties of the amplifier are discussed, the same design could be used at low frequencies. However, since this amplifier has an inductively coupled input its input impedance will be very low, essentially an electrical short at low frequencies, like the Clarke, et al. and Zimmerman, et al. amplifiers discussed above.

Another form of superconducting amplifier is discussed by Gray in "A Superconducting Transistor", Applied Physics Letters, Vol. 32, page 392 (1978), and by Faris, et al., in "QUITERON", IEEE Transactions on Magnetics, Vol. MAG-19, page 1293 (1983). These devices may have a relatively high input impedance and a large bandwidth but the mechanism for amplification relies on nonequilibrium quasiparticle tunneling, while an array amplifier constructed in accordance with the present invention is based on the electromagnetic phase locking of the Josephson oscillations, as will be discussed in more detail below.

SUMMARY OF THE PRESENT INVENTION

It therefore is an object of the present invention to provide a general purpose amplifier, using Josephson junctions, which has a wide bandwidth and sufficiently high impedance to allow connection to a large variety of signal sources.

It is a further object of the present invention to provide a general purpose Josephson junction amplifier which requires only a dc power source.

These objectives are accomplished in accordance with the present invention by an amplifier comprising: an array of series connected, mutually electromagnetically phase locked Josephson junctions operating in the finite voltage state; input terminals for applying an input signal across a first group of at least one but less than all of the junctions; and output terminals for taking an output signal from across a second group of the junctions which has a greater number of junctions than the first group. In accordance with another aspect of the present invention, two arrays of series connected Josephson junctions are connected in parallel to provide stable electromagnetic phase locking. These and other features and advantages are described in or apparent from the following detailed description of preferred embodiments.

BRIEF DESCRIPTION OF THE DRAWING

The preferred embodiments are described with reference to the accompanying drawing in which.

DETAILED DESCRIPTION OF THE INVENTION

Figure 1:
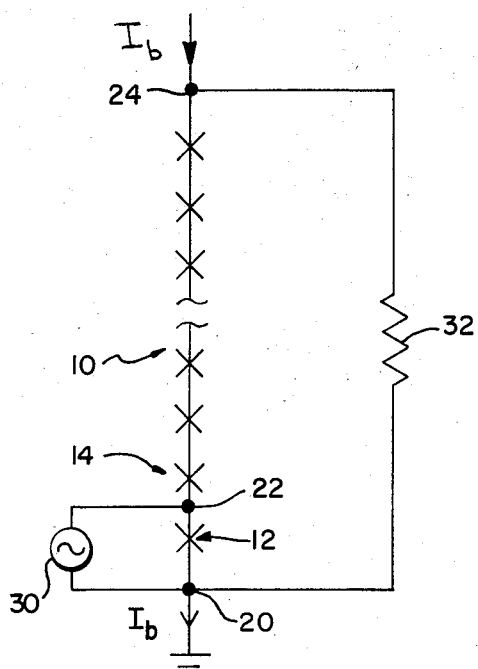
FIG. 1 is a schematic diagram of a first preferred embodiment of an amplifier constructed in accordance with the present invention.

FIG. 1 illustrates a first preferred embodiment of an amplifier constructed in accordance with the present invention, which comprises a linear array of Josephson junctions, generally denoted 10, connected in series. junctions 10 are maintained in the finite voltage state by a bias current $I_b$ supplied to the array as shown, and are mutually electromagnetically phase locked in a conventional manner. A terminal 20, which advantageously is connected to ground, as shown, and an input terminal 22, connected, for example, between junctions 12 and 14, are provided for connecting an input signal $V_{in}$ across junction 12. A further terminal 24 connected at the ungrounded end of the junction array is provided to connect, in cooperation with terminal 20, an output signal $V_o$ across a load 32. Junctions 10 are mutually electromagnetically phase locked at the fundamental Josephson frequency $f_j = 2eV/h$, where V is the average voltage across one of the Josephson junctions, e is the magnitude of the electric charge of an electron, and h is Plank's constant. Electromagnetic phase lock is maintained because of a common Josephson-frequency current through the series array and the load 32. Amplification of the input signal is achieved because of the phase locked nature of the array. When there is a change $\Delta V$ in the voltage on the input terminals, $V_{in}$, which occurs over a time period that is long compared with the period of one Josephson oscillation, the Josephson frequency of junction 12 will change. Due to the electromagnetic phase locking of that junction with the remaining junctions in the array, this frequency shift will be transmitted throughout the array. Since the Josephson frequency is directly related to the voltage across a junction, the net result will be a change in the output voltage $V_o$ with a magnitude of substantially $n\Delta V$ volts, i.e., the input voltage change will be increased by a factor of n, the number of junctions in the array.

It will be appreciated that electromagnetic phase locking can be obtained without every junction oscillating at the same fundamental Josephson frequency. In particular, the oscillation frequency of one junction may be the fundamental Josephson frequency and may be locked with the second or third harmonic of the Josephson oscillation frequency of another junction. In such a situation, the voltages across the various junctions differ, with the junction(s) oscillating at harmonics of the fundamental frequency having proportionally lesser voltages than the junction(s) oscillating at the fundamental frequency, and the voltage gain of an amplifier with such junctions will be a function both of the number of junctions which are connected across the input and output terminals, and the respective voltages of the individual junctions. The remaining discussion assumes that the embodiments are to be operated with all of the junctions oscillating at the fundamental Josephson frequency.

While the embodiment shown in FIG. 1 shows the signal being applied to the first junction in the series, with the output signal being taken across the entire array, it will be appreciated by those skilled in the art that the input signal can be applied across more than one of the junctions in the array, as long as the output is taken across a greater number of junctions. In addition, it will be appreciated that the input and output terminals can be connected across separate groups of junctions in the array, i.e., the input and output need not share a common terminal.

Furthermore, it will also be appreciated that the bias current $I_b$ of the embodiment of FIG. 1 need not be applied as indicated. The FIG. 1 embodiment represents the simplest bias condition, which uses only one current supply for $I_b$. A practical amplifier will have Josephson junctions with slight variations in parameters from one to the next, in which case the bias current in some of the junctions may have to be different from that in other junctions in order to achieve electromagnetic phase locking. An example of such an amplifier is illustrated in the embodiment of FIG. 3, wherein the number of current supplied is equal to the number of junctions.

Figure 2:
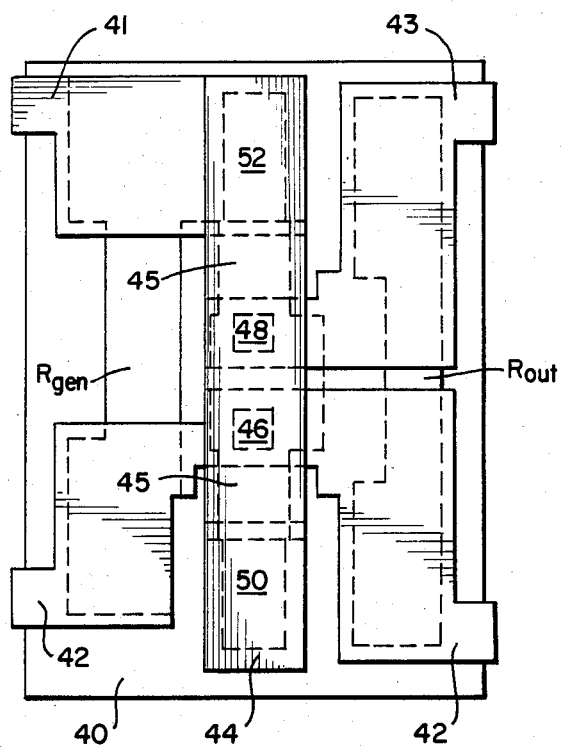
FIG. 2 illustrates the physical construction of a superconducting integrated test circuit which implements a two junction version of the embodiment shown in FIG. 1.
Figure 3:
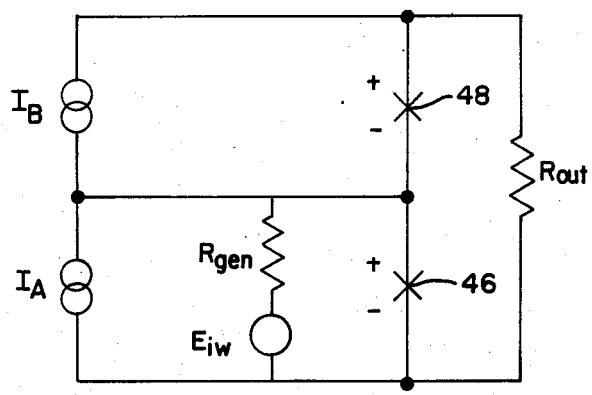
FIG. 3 is a schematic diagram of the embodiment shown in FIG. 2.

Referring to FIGS. 2 and 3, a two junction test version of the amplifier shown in FIG. 1 has been physically implemented. In addition to the amplifier components of the present invention, the test version has low noise voltage amplifiers (not shown) connected directly across the two junctions so that their voltages $V_1$, $V_2$ can be monitored simultaneously. A third low noise amplifier, followed by a 1 kHz phase sensitive detector (not shown) is connected across the load resistor $R_{out}$ to measure the output voltage of the array at the signal frequency. A source of current $I_A$ provides a low frequency triangular waveform for scanning the I-V characteristics, and the bias current supply $I_B$ is an adjustable DC supply. A low level signal voltage generator $E_{i\omega}$ (1 KHz), which is the Thevenin equivalent generator for a current source supplied in parallel with current $I_A$, provides the input signal $\Delta V$. The generator resistor $R_{gen}$ and the load resistor $R_{out}$ are part of the superconducting integrated circuit.

The actual integrated circuit is depicted in FIG. 2. The circuit comprises a Nb ground plate 40 under the amplifier, a Pb-In-Au input electrode 41, a Pb-In-Au common base electrode 42, a Pb-In-Au output base electrode 43, a Pb-Bi counter electrode 44, and AuIn$_2$ shunt resistors 45 under the counter electrode. Resistors $R_{gen}$ and $R_{out}$ are also made of AuIn$_2$. The counter electrode 44 is about 18 microns wide. The two Josephson junctions of the amplifier array are denoted 46 and 48 and are about 8 microns square. Larger area Josephson junctions 50 and 52, which remain in the zero voltage state, provide connections to the shunting resistors under the counter electrode, which make amplifier junctions 46 and 48 non-hysteretic. The critical currents of the amplifier junctions are about 300 microamperes and are equal within a few percent. The critical current density is estimated to be about 470 A/cm$^2$. Replicas of the resistors in the circuit, fabricated simultaneously with the amplifier, have resistances $R_{gen}=1.5$ ohm, $R_{out}=0.13$ ohm, and junction shunt resistances=0.30 ohms.

Voltage locking occurs with the dc bias current in the two junctions in the same direction, e.g., both currents downward (series locking), as in the embodiment of FIG. 3, or in opposite directions (parallel locking). However, if a conventional (differential) amplifier is used to detect the output signal, the output can be expected to be zero for parallel locking. Consequently, the following description is directed primarily to the series locking case.

Figure 4A:
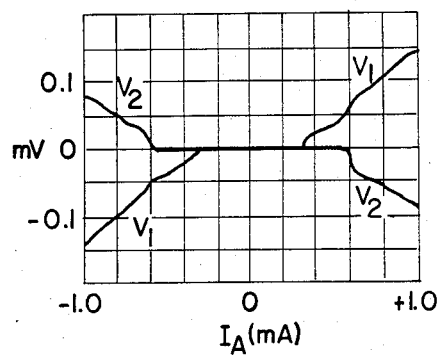
FIGS. 4(a) and 4(b) are graphs illustrating the experimental measurements of the voltages across the Josephson junctions in the embodiment of FIG. 2, with FIG. 4(a) showing the results with no bias current $I_B$ and FIG. 4(b) with a bias current slightly greater than the Josephson junction critical current.
Figure 4B:
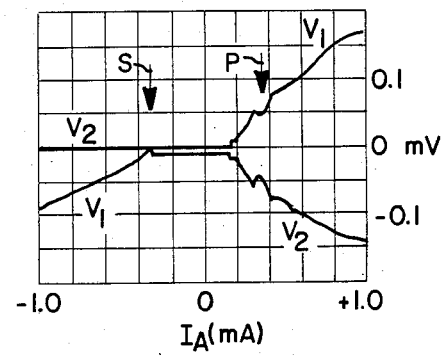

Referring to FIG. 4(a), the average voltage versus average current (V-I) characteristics of each junction of the amplifier, with $I_B$ set to zero, indicate that no useful voltage locking occurs. In contrast, as shown in FIG. 4(b), when $I_B$ is adjusted to slightly beyond the negative critical current of junction 48, the magnitudes of the junction voltages for positive values of $I_A$ are much more nearly equal. Regions of parallel locking are identified by the arrow P on the right-hand side of the figure. The distortions in the V-I curves, extending over about 0.12 mA, are similar to those observed in the locking range with prior art microbridges, except that here they are convex toward the zero voltage axis, whereas with microbridges the distortion was concave. This difference is probably due to the different impedances of this circuit compared with the microbridge circuits.

The possibility of series locking occurs where the V-I characteristics cross, as indicated by the arrow S on the lefthand side of FIG. 4(b). The series locking region can be moved to almost any voltage in the range of the figure simply by changing $I_B$, as described in more detail hereinbelow.

Figure 5:
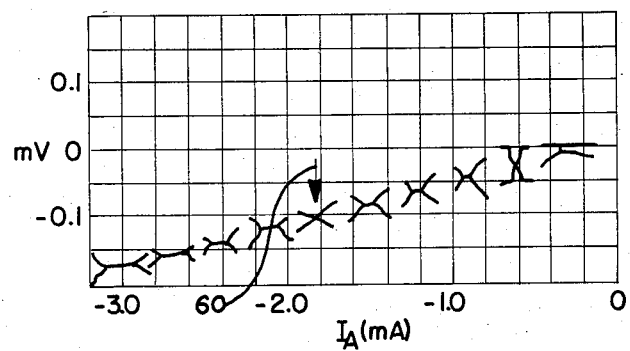
FIG. 5 graphically displays results similar to those shown in FIGS. 4(a) and 4(b) for numerous different applied bias currents.

FIG. 5 presents the results of a systematic study of the locking range (i.e., the range of $I_A$ over which locking is maintained, with fixed $I_B$) for series locking. Each of the X-shaped curves shown in the figure corresponds to the series locking portion of the curves shown in FIG. 4(b), for a different value of $I_B$ as $I_A$ is swept through the locking range. The series locking part of the curves shown in FIG. 4(b) corresponds to the set of curves at the extreme right of FIG. 5. Each successive set of curves to the left is for a larger (negative) value of $I_B$. The locking range goes through a minimum for the set of curves denoted by arrow 60.

As will be apparent to those skilled in the art from a review of FIG. 5, the locking range can be very large, about 60% of a junction's critical current. At the same time, however, there is an intermediate range of bias current at which the locking range becomes very small. This minimum, identified by arrow 60 in FIG. 5, probably is due to a circuit resonance. Such a minimum has not been observed with microbridges, but the frequency range of locking for microbridges is much smaller.

The properties of the amplifier circuit of FIGS. 2 and 3 as a low frequency amplifier have been surveyed as a function of $I_A$ and $I_B$. Maximum gain occurs for bias conditions near those for the minimum in the locking range denoted by the arrow 60 in FIG. 5. The V-I characteristics near that minimum are shown on expanded scales in FIGS. 6(a), 6(b), 7(a), and 7(b), and are labelled V1 and V2. Voltage locking is broken on the right hand side of each of the figures, where the curves diverge. The divergence to the left of the locking range is slightly beyond the boundaries of the figures. Across a large part of the locking range the V-I characteristics are nearly horizontal in these figures but, near the center of the locking range, there is clearly impedance structure that has positive and negative differential resistances (PDR and NDR) on the left and right, respectively. The probable cause of such structure is a circuit resonance.

Figure 6A:
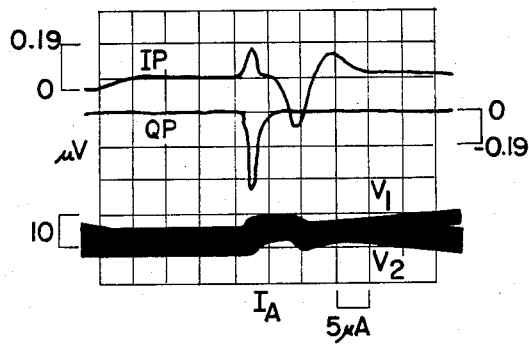
FIGS. 6(a) and 6(b) are graphs showing in greater detail experimental measurements of the output and input signals, respectively, in one of the phase-locked regions illustrated in FIG. 5.
Figure 6B:
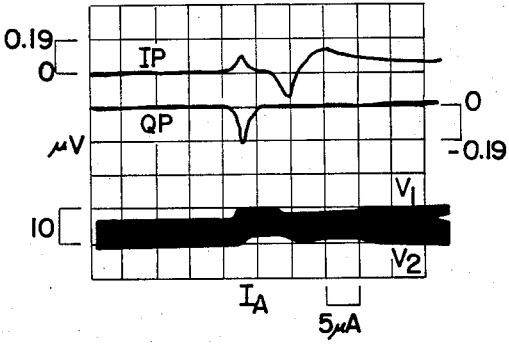

The signal-frequency response of the array on both its input and output terminals is given in FIGS. 6(a) and 6(b). Both the in-phase (labelled IP) and quadrature-phase (labelled QP) responses were measured, using as 1 second integration time, with the reference phase being that of the generator $E_{i\omega}$. FIG. 6(a) shows the output of the amplifier and the relation of the output to structure in the V-I characteristics. FIG. 6(b) shows the response at the input terminals and the relation of the input response to the same V-I characteristics as shown in FIG. 6(a). From a comparison of the output and input characteristics shown in FIGS. 6(a) and 6(b), respectively, it will be appreciated by those skilled in the art that the response at the output terminals is twice that at the input terminals, as expected for a phase-locked array with two Josephson junctions. The NDR in the V-I curves directly correlates with the negative peak (negative voltage means 180 degrees phase shifted from $E_{i\omega}$, of the in-phase channel of the phase detector, which is consistent with a quasistatic model of the amplifier. The PDR in the V-I curves has associated responses in both the in-phase and quadrature-phase channels. The in-phase response is consistent with a PDR but the quadrature-phase response is anomalous because it implies the presence of a significant effective reactance at the very low signal frequency. This phase shift may occur because of an underlying discontinuity in the PDR region, which discontinuity is masked by noise. Further discussion herein accordingly will focus on the NDR region.

Figure 7A:
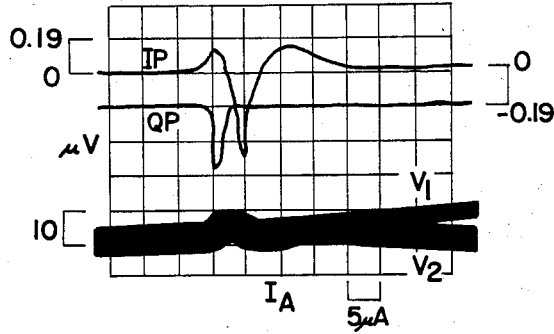
FIGS. 7(a) and 7(b) are similar to FIGS. 6(a) and 6(b), respectively, but for a different applied bias current.
Figure 7B:
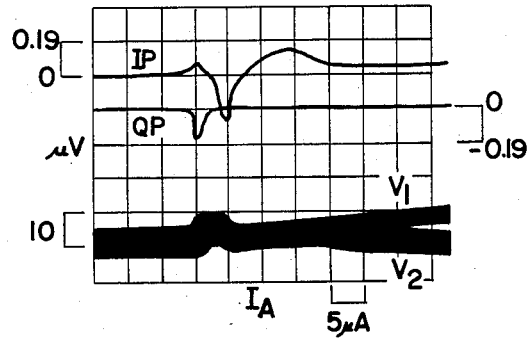

The gain and input impedance can be evaluated using FIGS. 7(a) and 7(b), which show the output and input responses, respectively, for a slightly different value of $I_B$. For these measurements $E_{i\omega}$ was set at 0.35 $\mu$V. The available power gain of the amplifier is given by the equation:

$$G = 4(|V_\omega|/E_{i\omega})^2 R_{gen}/R_{load}$$

where $V_\omega$ is the signal frequency voltage across $R_{load}$. The maximum negative output is $-0.46$ μV, which gives a power gain of 81, or 19 dB. Thus it is clearly established that a two junction array amplifier has substantial power gain.

Figure 8:
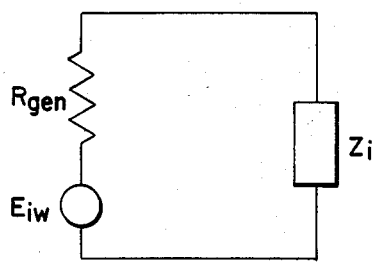
FIG. 8 is a schematic diagram of the Thevenin equivalent circuit for the embodiment shown in FIGS. 2 and 3.

If the array amplifier is analyzed in terms of the very small signal impedance $Z_i$ that it presents to the input signal generator, as shown in FIG. 8, then conventional circuit analysis will yield a value for the input impedance, assuming that the experimental result is used tha the voltage across $Z_i$ is one-half the output voltage $V_\omega$. The signal frequency input impedance so calculated is $Z_i = -0.40 R_{gen} = -0.61$ ohms. Thus the experimentally demonstrated amplifier has a negative real input impedance.

To determine the circuit conditions under which a large positive real input impedance can be produced, which is advantageous for general purpose amplification, the circuit of FIG. 3 has been analyzed using the approximate mathematical formalism of Likharev and Kuzmin which is set forth in "The Properties of a Quasi-Autonomous Josephson Contact", Radio Engineering and Electron Physics, Vol. 22, page 109 (1977). The approximate result obtained for the input impedance $Z_i$ is that $Z_i$ is proportional to $R_{load}$. Thus to make a large positive real input impedance, $R_{load}$ must be increased from the small value that was used in the experiments discussed above.

Figure 9:
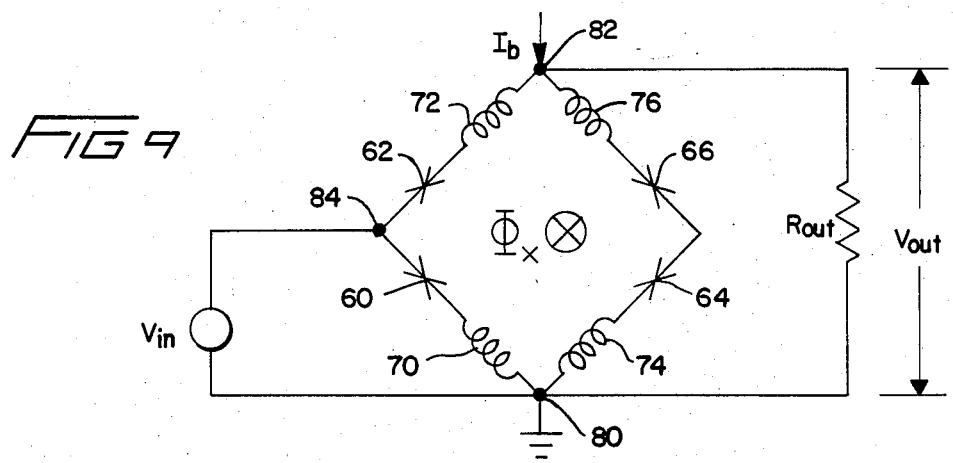
FIG. 9 is a schematic diagram of another preferred embodiment of an amplifier constructed in accordance with the present invention.

FIG. 9 illustrates a second preferred embodiment of the present invention in which a second array of Josephson junctions is connected in parallel to the first array as an alternative means of providing stable phase locking of the junctions. More particularly, this embodiment comprises a SQUID having a first pair of series connected Josephson junctions 60, 62, and a second pair of series connected Josephson junctions 64, 66 directly connected in parallel with the first pair. The corresponding inductances are represented by inductors 70, 72, 74 and 76, respectively. A ground terminal 80 is provided between junctions 60 and 64 and a current source (not shown) for supplying the bias current $I_b$ is connected to a terminal 82 provided between junctions 62 and 66, as shown. A third terminal 84 is provided between junctions 60 and 62. As is apparent from the figure, terminals 80 and 84 together serve as the input terminals, and terminals 82 and 80 as the output terminals. An input signal source $V_{in}$, having an amplitude $E_{i\omega}$ and resistance $R_{in}$, is connected to the input terminals. A load $R_{out}$ is connected across the output terminals.

Figure 10:
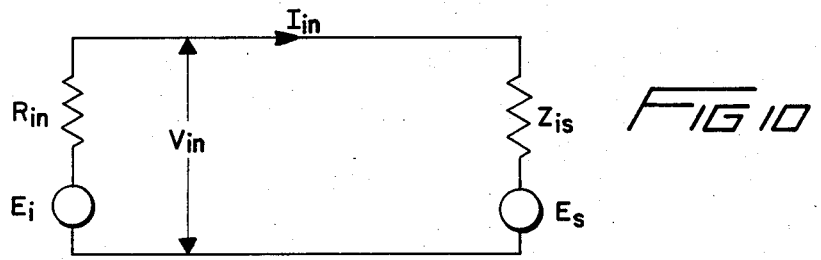
FIG. 10 is a schematic diagram of the Thevenin equivalent circuit for the embodiment illustrated in FIG. 9.

The embodiment of FIG. 9 will be further described based on a quasi-static analysis using the Thevenin small-signal equivalent circuit shown in FIG. 10, wherein $E_i$ and $R_{in}$ correspond to the dc signal amplitude and resistance of the input signal source $V_{in}$, and $E_s$ and $Z_{is}$ are the Thevenin equivalent voltage source and impedance, respectively, for the SQUID. The voltage across the input terminals 84, 80 is $$V_{in} = (E_i Z_{is} + E_s R_{in})/(Z_{is} + R_{in}). \tag{1}$$

As discussed above, the relationship between $V_{out}$ and $V_{in}$ is simply $V_{out} = 2V_{in}$, since the SQUID array has a total of two junctions in series.

For values of $E_i$ which are small and sinusoidal at low frequency, the available power gain is $$G(dc) = 16 \left(\frac{Z_{is}}{Z_{is} + R_{in}}\right)^2 \left(\frac{R_{in}}{R_{out}}\right). \tag{2}$$

The only unknown in expression (2) is the input impedance $Z_{is}$ of the SQUID. Phase locking provides such a simple relation between the input and output voltages that the familiar derivative of the output voltage with respect to applied magnetic flux does not appear in the gain. In fact, the usual characteristic of SQUID devices, that the input current modulates the flux through the loop, is not a significant factor in the case of an amplifier constructed in accordance with the present invention. However, the dc flux applied to the SQUID provides an important degree of freedom for adjusting $Z_{is}$.

Taking the simple case of $R_{in} = R_{out} = Z_{is}$, it is seen that the gain of the embodiment of FIG. 9 is 4. It will be seen below in connection with more detailed simulations that $Z_{is}$ takes on a variety of values, including negative ones, which means that the gain can be much larger than 4.

Returning again to the more detailed circuit diagram shown in FIG. 9, a dynamical analysis of the circuit can be conducted using the shunted junction model suggested by W. C. Stewart in 12 Applied Physics Letters 277 (1968); and D. E. McCumber, 39 Journal of Applied Physics 3113 (1968). The following circuit equations are the result:

$$\dot{\theta}_i = 2\pi V_i/\phi_o, \tag{3}$$

$$I_1 = I_3,$$

$$I_2 = [I_B - I_3 - (E_i - I_4 R_{in} + V_2)/R_{out}]/(1 + R_{in}/R_{out}),$$

$$\dot{I}_3 = [-V_1 + V_2 - V_3 + E_i + (I_2 - I_4)R_{in} - (L_3/L)\Phi_x]/L_3,$$

$$I_4 = [L_3 I_3 + (\theta_1 - \theta_2 + \theta_3 - \theta_4)\phi_o/2 + \Phi_x]/L_4,$$

$$\dot{V}_i = (I_1 - V_i/R - I_{ci}\sin\theta_i)/C, \; i = 1,2,3,4$$

$$V_{out} = E_i + (I_2 - I_4)R_{in} + V_2.$$

In these equations, the subscript $i = 1, 2, 3, 4$ denotes, respectively, the four arms of the array containing junctions 66, 62, 64 and 60. The critical currents, Josephson phase angles, voltage drops for the Joseph junctions, total current in each arm of the SQUID and inductance in each arm of the SQUID are designated by $I_{ci}, \theta_i, V_i, I_i,$ and $L_i$, respectively. The shunt resistance and capacitance of the junctions (not shown in FIG. 9) are represented by R and C, respectively. $\phi_o$ represents the flux quantum. The input voltage $E_i = E_{i\omega} \cos(\omega t)$; in practice, $E_i \sim 10^{-5} I_c R$. Finally, the dots above various quantities represent time derivatives.

$V_{out}$ is Fourier transformed to give the signal frequency output voltage $V_{o\omega}$, which is used in the following equation to compute the available power gain:

$$G = 4(V_{o\omega}/E_{i\omega})^2 (R_{in}/R_{out})$$

Figure 11:
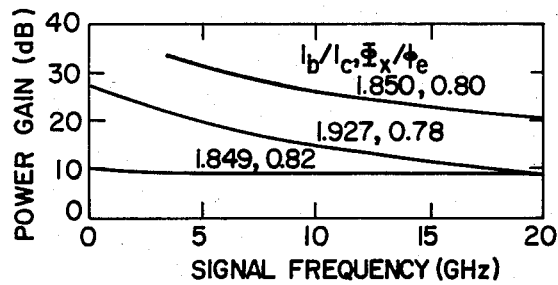
FIG. 11 illustrates the calculated available power gain versus the input signal frequency for the embodiment shown in FIG. 9.

To give a view of the bandwidth of the amplifier of FIG. 9, the gain was computed as a function of frequency using the differential equations (3) set forth above. The results of this computation are plotted in FIG. 11, which indicates that the frequency dependence of the gain varies considerably depending on the bias conditions. At low gain (on the order of 9 dB) and with a large positive $Z_{is}$ (20.1R), the gain is nearly flat from dc to 20 GHz. The gain is not flat for the other bias values shown, which perhaps indicates that the input impedance is reactive.

A significant feature of this SQUID is that it is not inductively coupled to an input circuit, so that its inductance can be made very small. Small inductance implies that the SQUID can be physically very small, which in turn suggests small parasitic reactances and a large bandwidth. Small inductance also allows the use of relatively large critical current junctions, which reduces the effects of noise on amplifier performance.

While the present invention has been described in connection with several preferred embodiments, it will be appreciated that variations and modifications can be made within the scope and spirit of the invention.

What is claimed is:

1. An amplifier comprising:
   an array of n Josephson junctions connected in series, where n is an integer greater than 1, said junctions being in a finite voltage state and mutually electromagnetically phase locked;
   input means having m of said Josephson junctions connected therebetween for connecting an input signal to said amplifier, m being an integer less than n and greater than 0; and
   output means including impedance load means and having at least m+1 Josephson junctions of said series connected therebetween for providing an output signal from said amplifier.

2. The amplifier of claim 1, wherein said input means comprises first and second terminals for providing direct coupling of an input signal to said amplifier, and wherein said output means comprises said first terminal and a third terminal.

3. The amplifier of claim 1, wherein said Josephson junctions are formed in a linear array.

4. The amplifier of claim 1 further comprising means for operating said Josephson junctions such that said amplifier exhibits a negative input impedance.

5. The amplifier of claim 1, wherein all of said junctions operate at substantially the same oscillation frequency, thereby producing a voltage gain which corresponds to the ratio of the number of junctions connected between said output means to the number of junctions connected between said input means.

6. A method of amplifying an input signal, comprising:
   applying the input signal across a first group of at least one but less than all of an array of series connected Josephson junctions which are in a finite voltage state and mutually electromagnetically phase locked;
   obtaining an output signal across a second group of said Josephson junctions which contains a greater number of junctions than said first group and to which an impedance load is connected.

7. An amplifier comprising:
   first and second arrays each of n Josephson junctions connected in series, wherein n is an integer greater than 1, said junctions being in a finite voltage state and mutually electromagnetically phase locked, and said second array being connected in parallel with said first array;
   input means having m of said Josephson junctions of said first array connected therebetween for connecting an input signal to said amplifier, m being an integer less than n and greater than 0; and
   output means including impedance load means and having at least m+1 Josephson junctions of said second array connected therebetween for providing an output signal from said amplifier.

8. The amplifier of claim 7, wherein the said first and second arrays are directly connected in parallel to form a SQUID.

* * * * *